(12) United States Patent
Cho et al.

(10) Patent No.: US 6,501,114 B2
(45) Date of Patent: Dec. 31, 2002

(54) STRUCTURES COMPRISING TRANSISTOR GATES

(75) Inventors: Chih-Chen Cho, Boise, ID (US); Richard H. Lane, Boise, ID (US); Charles H. Dennison, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/938,463

(22) Filed: Aug. 23, 2001

(65) Prior Publication Data

US 2002/0025644 A1 Feb. 28, 2002

Related U.S. Application Data

(62) Division of application No. 09/518,508, filed on Mar. 3, 2000.

(51) Int. Cl.[7] .............................................. H01L 27/108
(52) U.S. Cl. .................... 257/296; 257/300; 257/306; 438/241; 438/303; 438/305
(58) Field of Search ................. 257/296, 299, 257/300, 306; 438/241, 303, 305

(56) References Cited

U.S. PATENT DOCUMENTS

| | | | | |
|---|---|---|---|---|
| 5,237,187 A | * | 8/1993 | Suwanai et al. | 257/296 |
| 5,847,428 A | * | 12/1998 | Fulford, Jr. et al. | 257/344 |
| 5,899,721 A | * | 5/1999 | Gardner et al. | 438/303 |
| 6,033,981 A | | 3/2000 | Lee et al. | 438/624 |
| 6,040,223 A | | 3/2000 | Liu et al. | 438/303 |
| 6,150,689 A | * | 11/2000 | Narui et al. | 257/306 |
| 6,153,455 A | | 11/2000 | Ling et al. | 438/231 |
| 6,153,476 A | * | 11/2000 | Inaba et al. | 438/275 |
| 6,165,826 A | * | 12/2000 | Chau et al. | 438/231 |
| 6,198,144 B1 | | 3/2001 | Pan et al. | 257/412 |
| 6,278,152 B1 | * | 8/2001 | Hieda et al. | 257/306 |
| 6,319,779 B1 | * | 11/2001 | Ahmad et al. | 438/275 |
| 6,344,692 B1 | * | 2/2002 | Ikemasu et al. | 257/296 |

* cited by examiner

Primary Examiner—Carl Whitehead, Jr.
Assistant Examiner—Jeff Vockrodt
(74) Attorney, Agent, or Firm—Wells St. John P.S.

(57) ABSTRACT

The invention encompasses a method of forming a portion of a transistor structure. A substrate is provided, and a transistor gate is formed over the substrate. The transistor gate has a sidewall. A silicon oxide is deposited over a portion of the substrate proximate the transistor gate by high density plasma deposition. A spacer is formed over the silicon oxide and along the sidewall of the transistor gate. The invention also encompasses a method of oxidizing a portion of a conductive structure. Additionally, the invention encompasses transistor gate structures, as well as structures comprising memory array and peripheral circuitry.

11 Claims, 8 Drawing Sheets

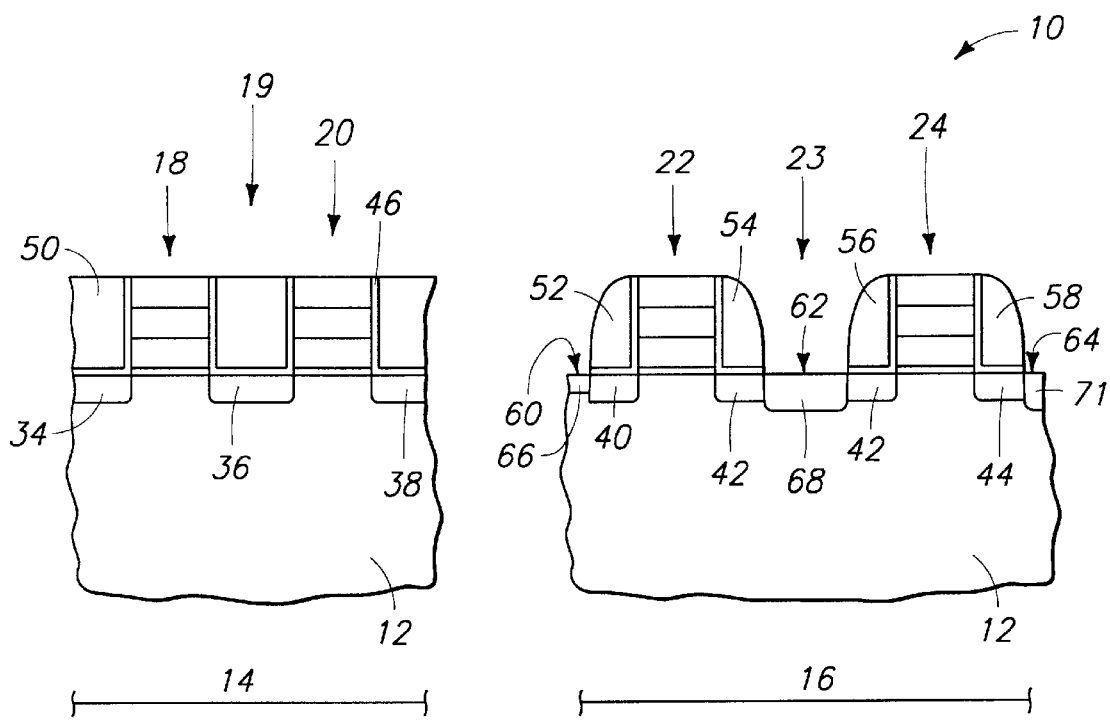
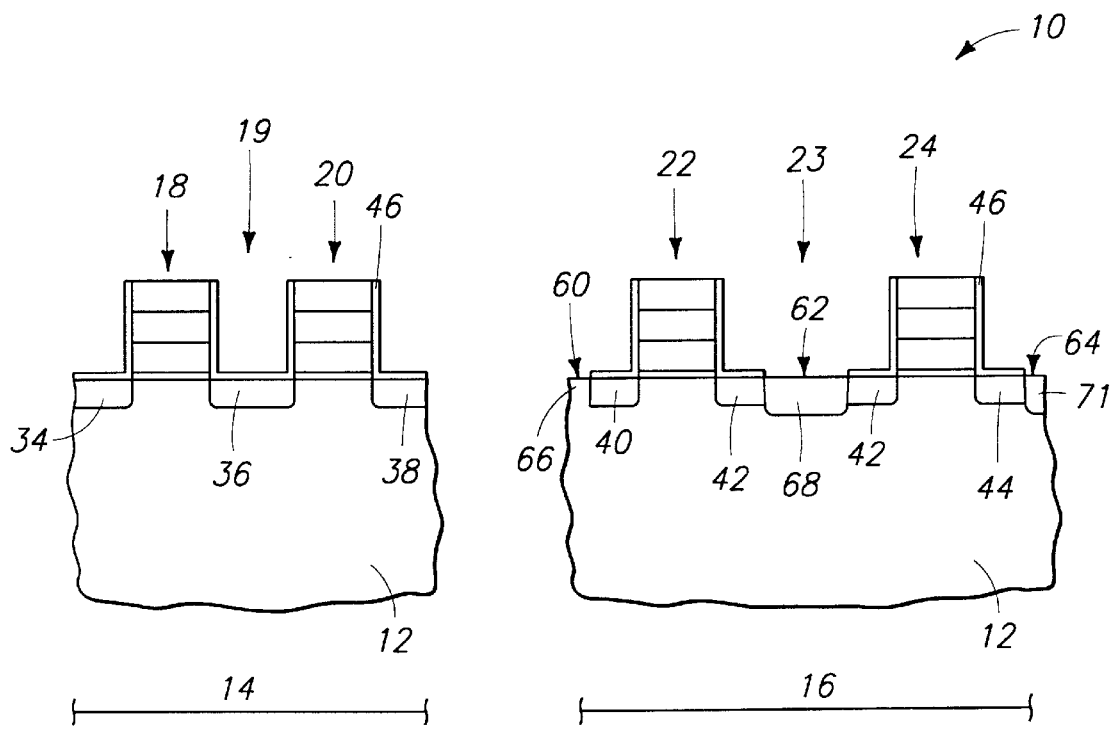

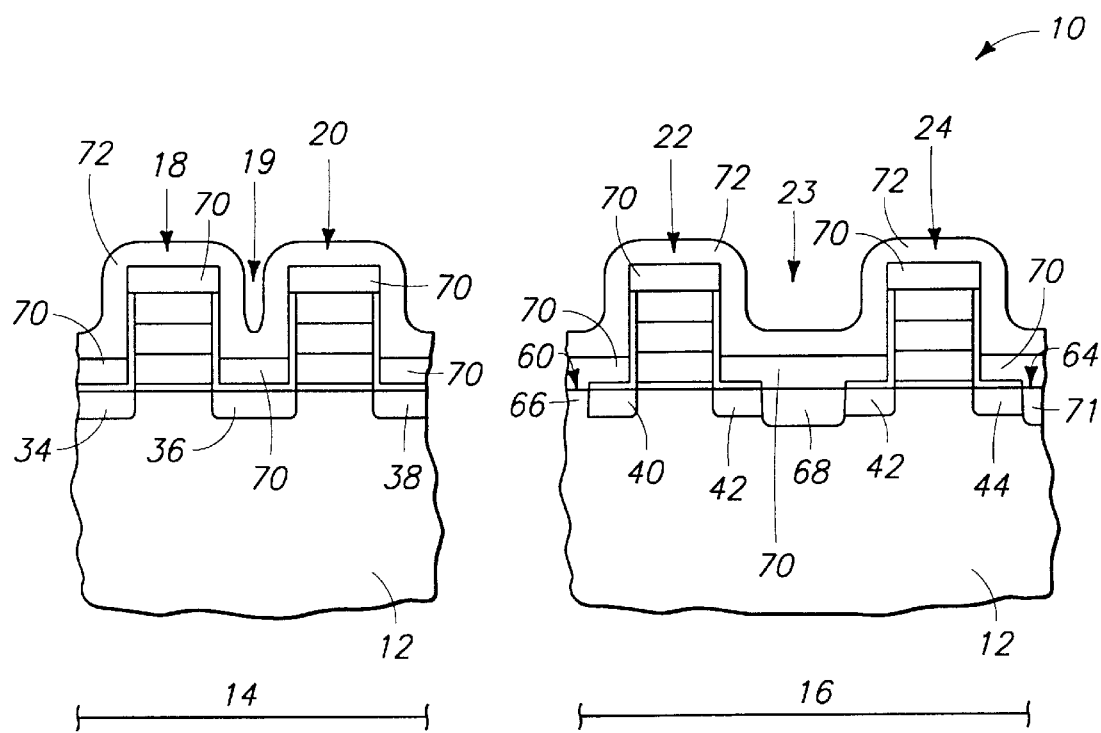
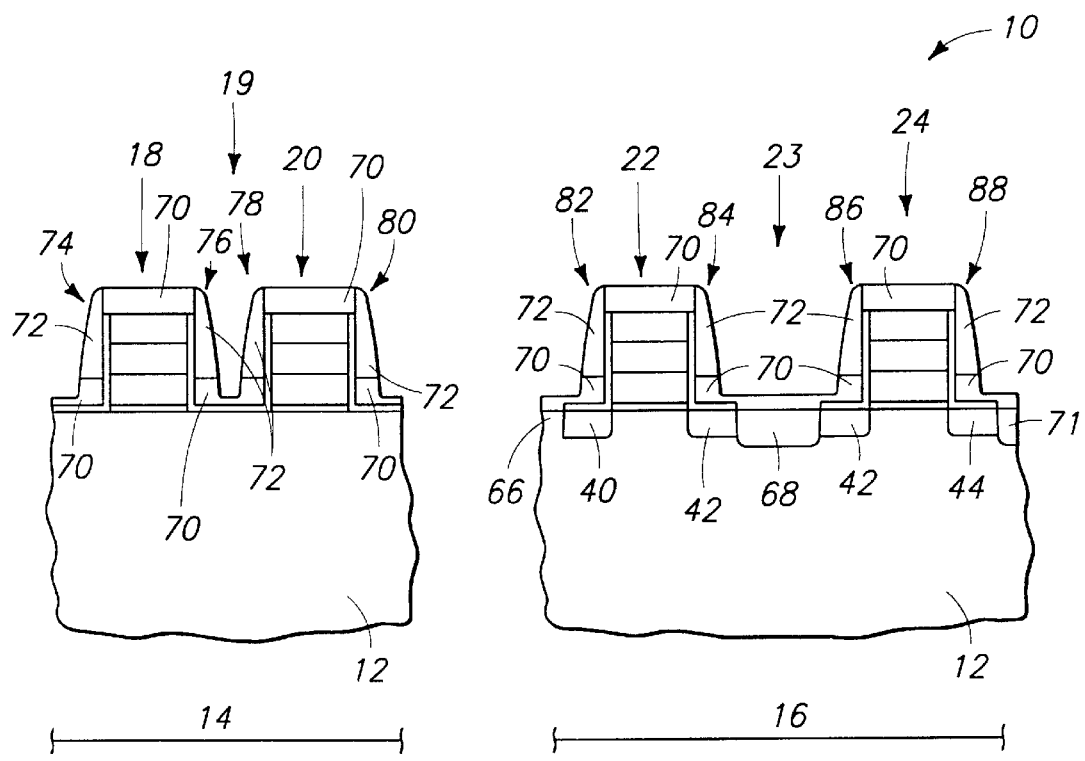

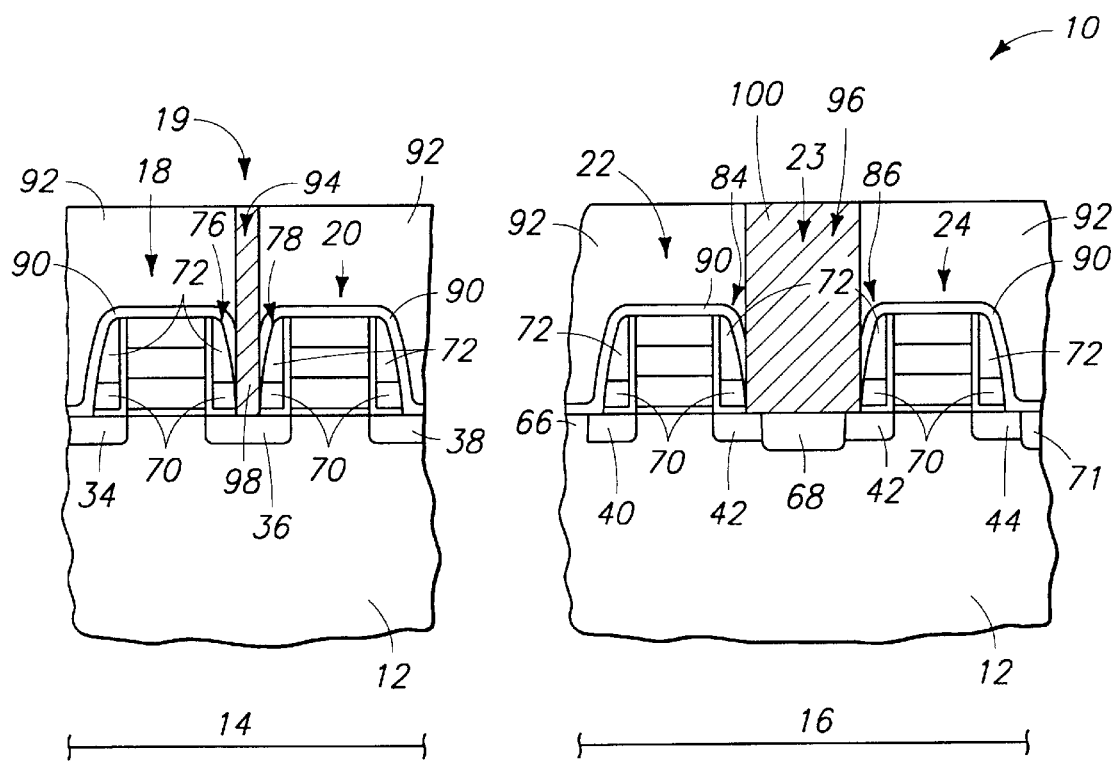
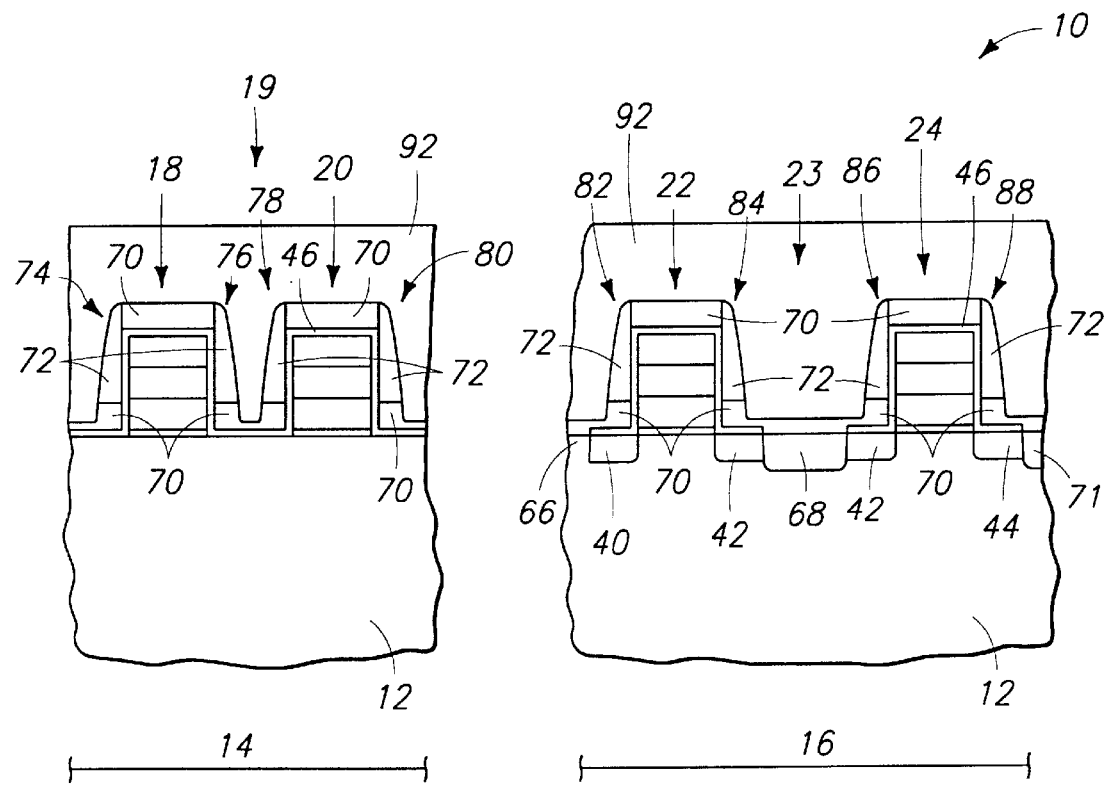

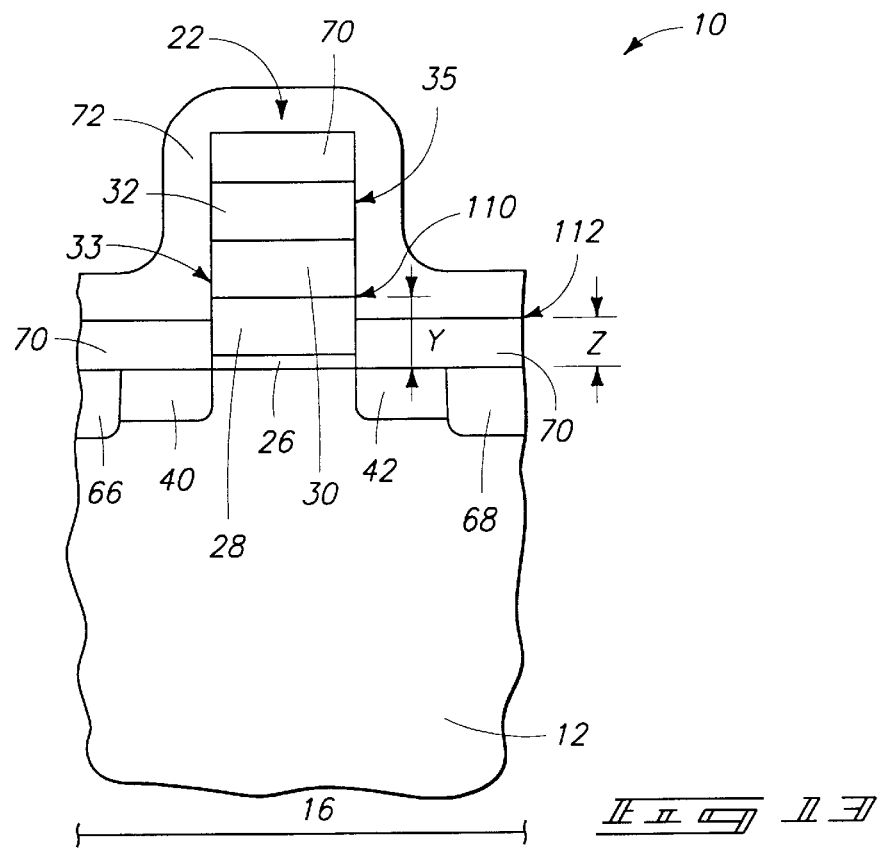
_Fig. 13_
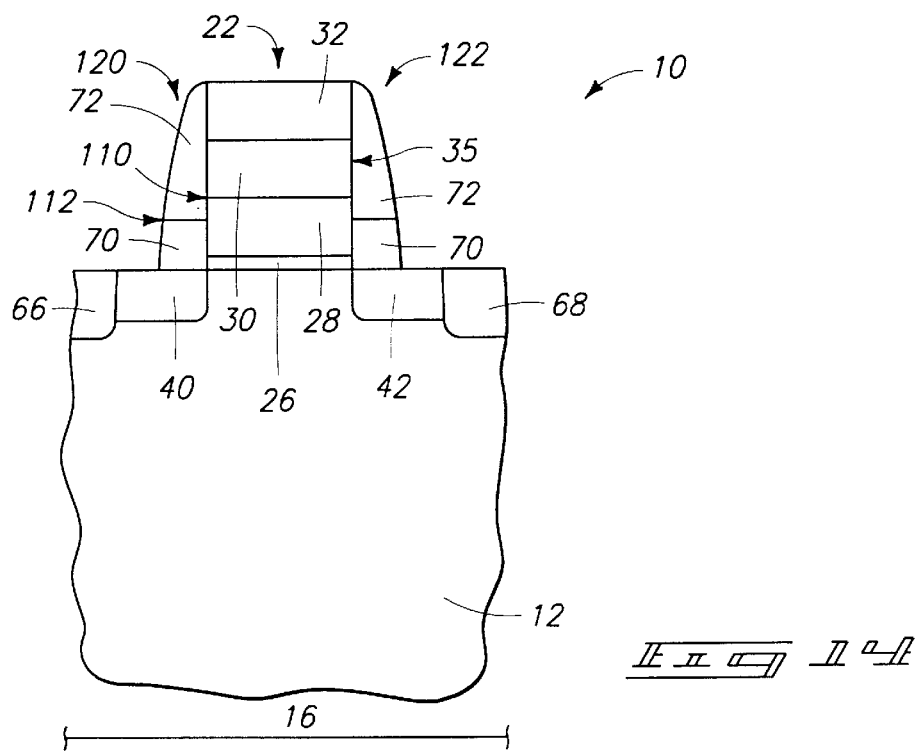
_Fig. 14_

STRUCTURES COMPRISING TRANSISTOR GATES

RELATED PATENT DATA

This patent is a divisional application of U.S. patent Application Ser. No. 09/518,508 which was filed on Mar. 3, 2000.

TECHNICAL FIELD

The invention pertains to methods of forming transistor structures, as well as to methods of forming array and peripheral circuitry. Also, the invention pertains to structures comprising transistor gates.

BACKGROUND OF THE INVENTION

Transistor gates are commonly utilized as electrical components in semiconductor circuits. The transistor gates comprise electrically conductive materials, and a continuing goal in semiconductor processing is to develop structures for electrically insulating the conductive gate materials relative to surrounding conductive circuitry. Typically, the conductive gate materials have an electrically insulative cap formed on top of them, and also have electrically insulative spacers formed alongside them. Among the challenges in semiconductor processing is a continuing goal to reduce process steps. Accordingly, it is generally desired to incorporate the formation of insulative materials adjacent a conductive gate with other process steps. For instance, the insulative spacers formed alongside a conductive gate are frequently utilized not only for insulating the gate, but also for aligning a subsequent source/drain implant into a substrate adjacent the gate.

It is noted that not only is there a continuing goal to reduce process steps in fabrication of individual gates, but there is also a goal to reduce fabrication steps relative to a plurality of transistors formed on a common semiconductive material wafer. For instance, a memory chip will frequently have an array of transistors utilized in memory devices (a so-called memory array), and other transistors surrounding the array and utilized in logic functions (so-called peripheral circuitry). It is desired to develop fabrication steps which simultaneously form structures in both memory array regions and peripheral circuitry regions of a memory chip.

SUMMARY OF THE INVENTION

In one aspect, the invention encompasses a method of forming a portion of a transistor structure. A substrate is provided, and a transistor gate is formed over the substrate. The transistor gate has a sidewall. A silicon oxide is deposited over a portion of the substrate proximate the transistor gate by high density plasma deposition. A spacer is formed over the silicon oxide and along the sidewall of the transistor gate.

In another aspect, the invention encompasses a method of forming memory array and peripheral circuitry. A substrate is provided. A memory array region and peripheral circuitry region are defined within the substrate. A pair of adjacent memory transistor gates are formed over the memory array region of the substrate, and the pair of adjacent peripheral transistor gates are formed over the peripheral region of the substrate. The adjacent peripheral transistor gates are separated by a larger distance than are the adjacent memory transistor gates. A spacer material is formed over the memory transistor gates, as well as over a portion of the substrate between the memory transistor gates. Also, the spacer material is formed over the peripheral transistor gates, as well as over a portion of the substrate between the peripheral transistor gates. The spacer material is etched to form separated spacers between the adjacent peripheral transistor gates, but the etching does not form separated spacers between the adjacent memory transistor gates.

In yet another aspect, the invention encompasses a method of oxidizing a portion of a conductive structure. A conductive structure is formed over a substrate. The conductive structure comprises a conductively-doped semiconductive material and a metal-containing material over the conductively-doped semiconductive material. The structure comprises a sidewall, and the sidewall has a portion defined by the metal-containing material as well as a portion defined by the conductively-doped semiconductive material. A silicon oxide is formed along the sidewall. The silicon oxide is along at least some of the portion defined by the conductively-doped semiconductive material, and is not along the portion defined by the metal-containing material. A silicon nitride is formed over the silicon oxide. The silicon nitride is along the portion defined by the metal-containing material. At least some of the portion of the sidewall defined by the conductively-doped semiconductive material is oxidized through the silicon oxide. The silicon nitride is utilized as a protective barrier over the portion of the sidewall defined by the metal-containing material to protect the metal-containing material from being oxidized during the oxidizing of the portion of the sidewall defined by the conductively-doped semiconductive material.

In other aspects, the invention encompasses transistor gate structures, as well as structures comprising memory array and peripheral circuitry.

BRIEF DESCRIPTION OF THE DRAWINGS

Preferred embodiments of the invention are described below with reference to the following accompanying drawings.

FIG. 3 is a view of the FIG. 1 wafer fragment shown at a processing step subsequent to that of FIG. 2.

FIG. 4 is a view of the FIG. 1 wafer fragment shown at a processing step subsequent to that of FIG. 3.

FIG. 5 is a view of the FIG. 1 wafer fragment shown at a processing step subsequent to that of FIG. 4.

FIG. 6 is a view of the FIG. 1 wafer fragment shown at a processing step subsequent to that of FIG. 5.

FIG. 9 is a view of the FIG. 1 wafer fragment shown at a processing step subsequent to that of FIG. 8.

FIG. 10 is a view of the FIG. 1 wafer fragment shown at a processing step subsequent to that of FIG. 6, in accordance with a second embodiment of the invention.

FIG. 13 is a view of the FIG. 12 portion shown at a processing step subsequent to that of FIG. 12.

FIG. 14 is a view of the FIG. 12 portion shown at a processing step subsequent to that of FIG. 13.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
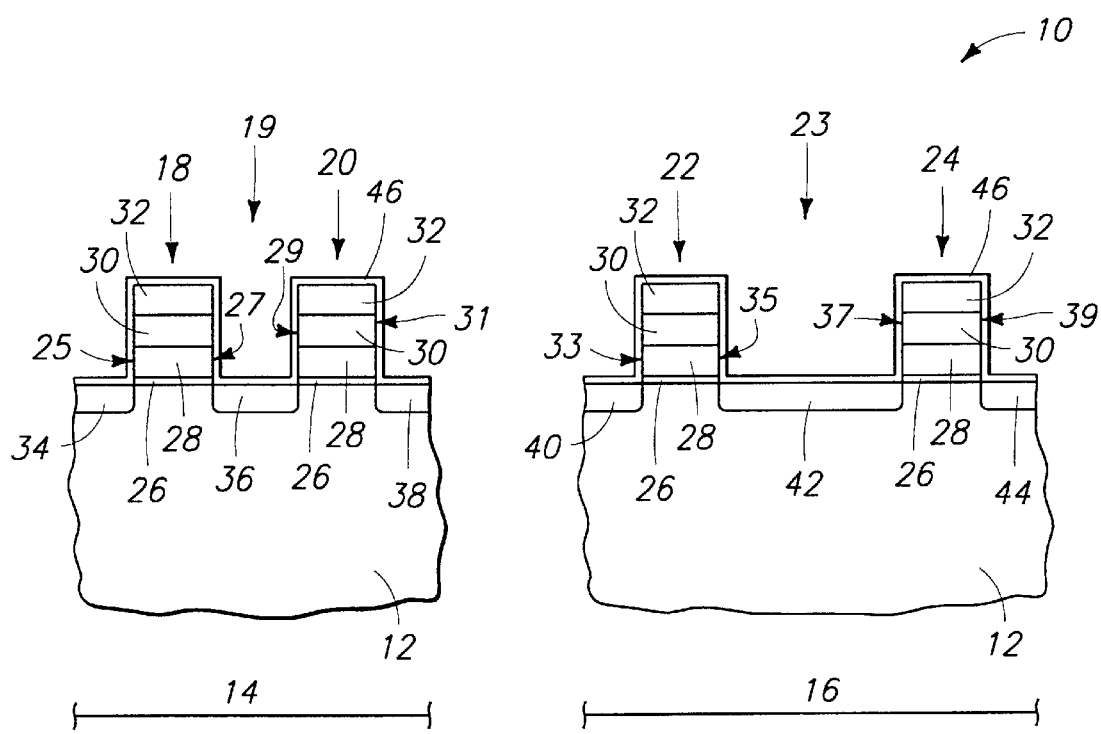
FIG. 1 is a fragmentary, diagrammatic view of a semiconductor wafer shown at a preliminary processing step of a method encompassed by the present invention. The wafer is shown comprising a memory array region 14 and a peripheral circuitry region 16.

An exemplary method of the present invention is described with reference to FIGS. 1–9. Referring first to FIG. 1, a semiconductive material wafer fragment 10 is illustrated at a preliminary processing step of the exemplary method. Semiconductive material wafer fragment 10 comprises a substrate 12, which is shown subdivided into regions 14 and 16. Region 14 corresponds to a memory array region of substrate 12, and region 16 corresponds to a peripheral circuitry region of substrate 12. Substrate 12 can comprise, for example, a monocrystalline silicon wafer lightly doped with a p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Transistor gates 18 and 20 are formed over memory array region 14 of substrate 12, and transistor gates 22 and 24 are formed over peripheral circuitry region 16 of substrate 12. Transistor gates 18 and 20 are adjacent to one another, and separated from one another by a gap 19. Likewise, transistor gates 22 and 24 are adjacent to one another and separated by a gap 23. The spacing between adjacent peripheral circuitry gates 22 and 24 is larger than the spacing between memory array transistor gates 18 and 20, as evidenced by the larger size of gap 23 relative to gap 19. An exemplary spacing between adjacent memory transistor gates 18 and 20 is from about 0.1 microns to about 0.25 microns, and an exemplary spacing between adjacent peripheral circuitry gates 22 and 24 is from about 0.2 microns to about 10 microns.

Transistor gates 18, 20, 22 and 24 comprise stacked layers of gate oxide 26, conductively-doped semiconductive material 28, metal-containing material 30, and an insulative cap 32. Gate oxide 26 can comprise, for example, silicon dioxide; conductively-doped semiconductive material 28 can comprise, for example, conductively doped polycrystalline silicon; metal-containing material 30 can comprise, for example, tungsten or titanium, and can further comprise a metal silicide; and insulative cap 32 can comprise, for example, silicon dioxide or silicon nitride.

N-type diffusion regions 34, 36 and 38 are formed proximate memory transistor gates 18 and 20, and n-type diffusion regions 40, 42 and 44 are formed proximate peripheral transistor gates 22 and 24. Diffusion regions 34, 36 and 38 constitute source/drain regions for memory array transistors, whereas diffusion regions 40, 42 and 44 constitute lightly doped diffusion regions ($L_{dd}$) regions for peripheral circuitry transistors. Regions 34, 36, 38, 40, 42 and 44 can be simultaneously implanted into substrate 12. Although the shown embodiment comprises forming NMOS transistors at both the memory array and peripheral regions, it is to be understood that PMOS transistors can also be formed relative to substrate 12, and would typically also be formed relative to peripheral circuitry region 16. If PMOS transistors were formed, such transistors could be isolated from the shown NMOS transistors by different substrate doping and/or by insulative isolation regions, such as, for example, shallow trench isolation regions. Also, p-type diffusion regions could be formed associated with the PMOS transistors to form $L_{dd}$ regions and/or source/drain regions. It is also noted that although halo regions are not shown relative to transistor gates 22 and 24, such regions can be formed by implanting p-type dopant proximate gates 22 and 24. If such halo regions are formed, memory array region 14 of substrate 12 can be masked during formation of the halo regions to avoid implanting p-type dopant within substrate regions proximate memory array transistor gates 18 and 20.

Still referring to FIG. 1, an etch-stop material 46 is formed over memory array and peripheral circuitry regions 14 and 16 of substrate 12. Etch-stop material 46 can comprise, for example, silicon nitride, can be formed by, for example, chemical vapor deposition, and can have an exemplary thickness of less than or equal to about 50 Å. Etch-stop material 46 extends conformally over memory array transistor gates 18 and 46, as well as over the substrate in region 19 between gates 18 and 20. Also, etch-stop material 46 extends conformally over gates 22 and 24, as well as over the substrate in region 23 between gates 22 and 24.

Transistor gates 18, 20, 22 and 24 comprise sidewalls 25, 27, 29, 31, 33, 35, 37 and 39. Such sidewalls comprise a portion defined by metal-containing material 30, and another portion defined by conductively-doped semiconductive material 28.

Figure 2:
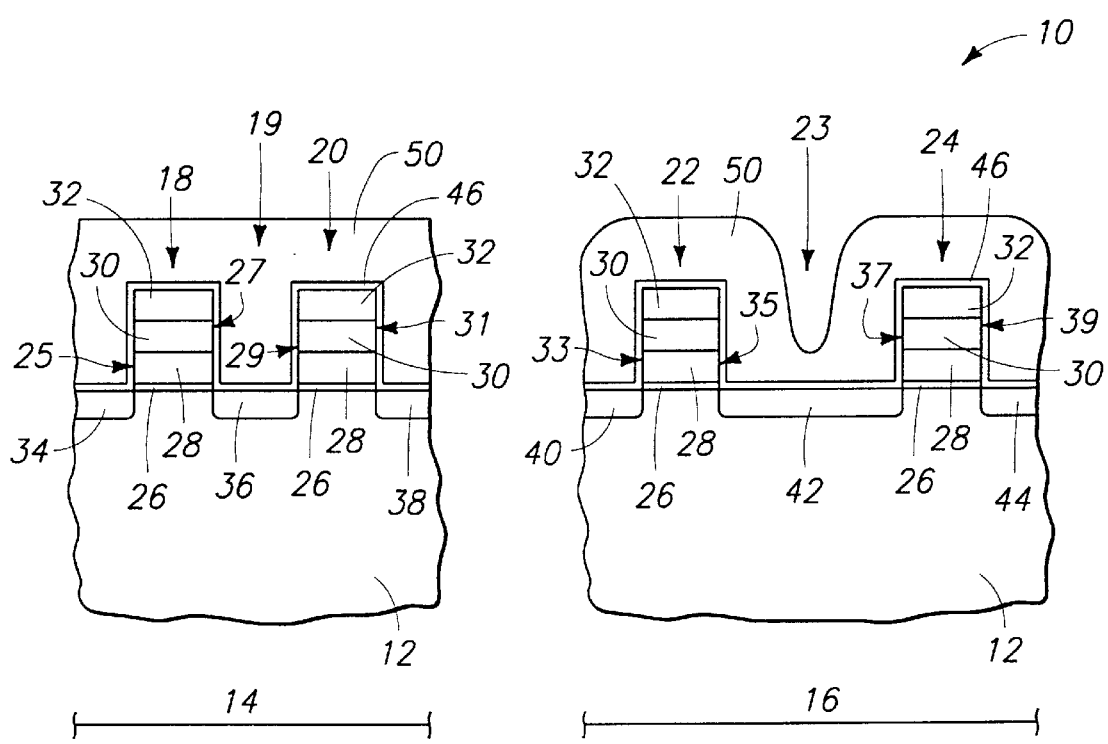
FIG. 2 is a view of the FIG. 1 wafer fragment shown at a processing step subsequent to that of FIG. 1.

Referring to FIG. 2, a first spacer material 50 is deposited over memory array region 14 and peripheral circuitry region 16 of substrate 12, and is formed between memory array transistor gates 18 and 20, as well as between peripheral circuitry transistor gates 22 and 24. First spacer material 50 comprises a different composition than etch-stop material 46, and can comprise, for example, silicon dioxide. Such silicon dioxide can be deposited by, for example, chemical vapor deposition. In particular embodiments, etch-stop material 46 can consist essentially of silicon nitride, and first spacer material 50 can consist essentially of silicon dioxide. First spacer material 50 can be formed to an exemplary thickness of about 100 nanometers.

Referring to FIG. 3, first spacer material 50 is anisotropically etched, and preferably is selectively etched relative to etch-stop material 46. For instance, if etch-stop material 46 comprises silicon nitride and first spacer material 50 comprises silicon dioxide, a suitable etch for selectively etching the silicon oxide relative to the silicon nitride is a fluorocarbon-based plasma etch. It is to be understood that the term "selective etching" as utilized herein does not necessarily mean that one material is etched while another material is not, but rather that a material is etched faster than another material.

The etching of first spacer material 50 forms sidewall spacers 52, 54, 56 and 58 adjacent sidewalls of peripheral transistor gates 22 and 24. Spacers 54 and 56 are between peripheral transistor gates 22 and 24, and separated from one another. In contrast, although the material 50 over memory array region 14 of substrate 12 is also exposed to the etching conditions that formed spacers 52, 54, 56 and 58, separated spacers are not formed between memory array transistor gates 18 and 20. Separated spacers are not formed between memory array transistor gates 18 and 20 because such transistor gates are closer together than are the transistor gates 22 and 24 over the peripheral circuitry region, and accordingly spacer material 50 was deposited thicker over the gap 19 between memory array transistor gates 18 and 20 than over the gap 23 between peripheral transistor gates 22 and 24 (see FIG. 2).

After the etch of spacer material 50, portions of etch-stop material 46 are exposed between and adjacent spacers 52, 54, 56 and 58, and in the shown embodiment, such exposed portions have been removed. The removal can be accomplished with, for example, an etch utilizing $CF_4/O_2$. Such etch could also remove etch-stop material 46 from over the tops of transistor gates 18, 20, 22 and 24, although such removal is not illustrated in the shown embodiment. In any event, the removal of etch-stop material 46 from adjacent and between spacers 52, 54, 56 and 58 exposes peripheral substrate regions 60 62 and 64. N-type dopant is implanted into such exposed substrate regions to form heavily-doped source/drain regions 66, 68 and 71. The regions 66, 68 and 71 are referred to as "heavily-doped" because they are more heavily doped than regions 40, 42 and 44, and would typically be doped to a concentration of at least $1 \times 10^{19}$ atoms/cm$^3$ with conductivity-enhancing dopant. Spacers 52, 54, 56 and 58 are utilized to align source/drain regions 66, 68 and 71 relative to transistor gates 22 and 24. Although in the shown embodiment etch-stop material 46 is removed from adjacent and between spacers 52, 54, 56 and 58 prior to an implant of source/drain regions 66, 68 and 71, it is to be understood that in other embodiments (not shown), etch-stop material 46 could remain adjacent and between spacers 52, 54, 56 and 58, and the source/drain regions implanted through etch-stop material 46.

Referring to FIG. 4, spacers 52, 54, 56 and 58 (FIG. 3) are removed from over peripheral region 16 of substrate 12, and first spacer material 50 (FIG. 3) is removed from over memory array region 14 of substrate 12. The removal of first spacer material 50 and spacers 52, 54, 56 and 58 can be accomplished utilizing a wet etch, and preferably utilizes etching conditions selective for first spacer material 50 relative to etch-stop material 46 and silicon substrate 12. In embodiments in which first spacer material 50 comprises silicon dioxide and etch-stop material 46 comprises silicon nitride, suitable conditions for removing silicon dioxide first spacer material 50 selectively relative to silicon nitride etch-stop material 46 include etching with hydrofluoric acid.

Referring to FIG. 5, a protective material 70 is deposited over memory array region 14 and peripheral circuitry region 16 of substrate 12. Protective material 70 can comprise, for example, silicon oxide (specifically, silicon dioxide) deposited by high density plasma deposition (wherein the term "high density plasma" is defined to mean a plasma comprising $10^{12}$ ions/cm$^3$). Such high density plasma deposition will selectively form material 70 adjacent and between transistor gates 18, 20, 22 and 24, but will form little, if any, material 70 along sidewalls of the transistor gates (for instance, the material 70 can be formed to be about 600 Å thick between the transistor gates, and less than or equal to about 100 Å thick on sidewalls of the transistor gates). To the extent that material 70 deposits along sidewalls of the transistor gates, such will be deposited as a thin film, which can be removed with a hydrofluoric acid dip.

After formation of protective material 70, a second spacer layer 72 is deposited over memory array region 14 and peripheral circuitry region 16. Second spacer material 72 can comprise a material which can be selectively removed relative to protective material 70. For instance, if protective material 70 comprises silicon dioxide, second spacer material 72 can comprise silicon nitride. Second spacer material 72 can be deposited by, for example, chemical vapor deposition. Second spacer material 72 is preferably formed to a thickness of from about 30 nanometers to about 70 nanometers, and accordingly is formed to be thinner than was first spacer material 50 (see FIG. 2). The relatively thin layer 72 is utilized to form spacers adjacent transistor gates 18 and 20 of memory array region 14, as well as to form spacers adjacent transistor gates 22 and 24 of peripheral circuitry region 16.

FIG. 6 shows wafer fragment 10 after spacers have been formed from second spacer material 72. Specifically, second spacer material 72 has been subjected to anisotropic etching conditions which forms spacers 74, 76, 78, 80, 82, 84, 86 and 88. Note that the anisotropic etching conditions have also etched some of protective material 70 to incorporate some of protective material 70 into the spacer constructions. In addition to a timed, non-selective etch, the etch of second spacer material 72 can be selective for second spacer material 72 relative to the material of protective layer 70. For instance, if second spacer material 72 comprises silicon nitride and protective material 70 comprises silicon dioxide, a suitable etch can comprise $Cl_2$, or hydrogen-rich fluorocarbons with some oxidant and low ion bombardment energy. However, in spite of the selectivity of such etch, there will typically be some etching of protective silicon dioxide material 70 during the etching of silicon nitride spacer material 72.

Figure 7:
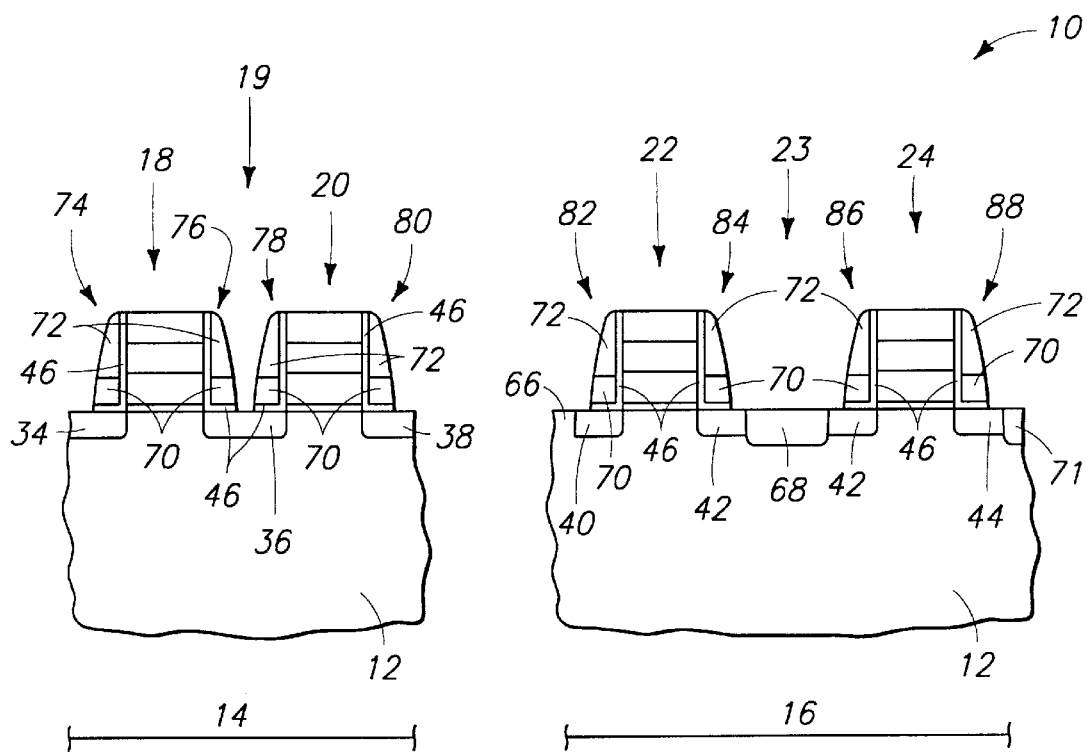
FIG. 7 is a view of the FIG. 1 wafer fragment shown at a processing step subsequent to that of FIG. 6.

FIG. 7 shows wafer fragment 10 after further etching of materials 72 and 70 to define spacers 74, 76, 78, 80, 82, 84, 86 and 88, and to remove material 70 from over the substrate in gaps 19 and 23. The etching has also removed protective material 70 from over tops of transistor gates 18, 20, 22 and 24, and removed etch-stop material 46 from over gates 18, 20, 22 and 23. Additionally, the etching has removed etch-stop material 46 from between adjacent memory array transistor gates 18 and 20.

It is noted that spacers 74, 76, 78, 80, 82, 84, 86 and 88 preferably comprise a layer of silicon dioxide (70) elevationally between a pair of silicon nitride layers (46 and 72). It is also noted that source/drain regions 66, 68 and 71 are spaced from gates 22 and 24 further than a lateral spacing of the spacers 82, 84, 86 and 88. Such distancing of the source/drain regions from the gates occurs because the source/drain regions were aligned to thicker spacers (specifically, spacers 52, 54, 56 and 58 of FIG. 3), than the spacers 82, 84, 86 and 88.

Figure 8:
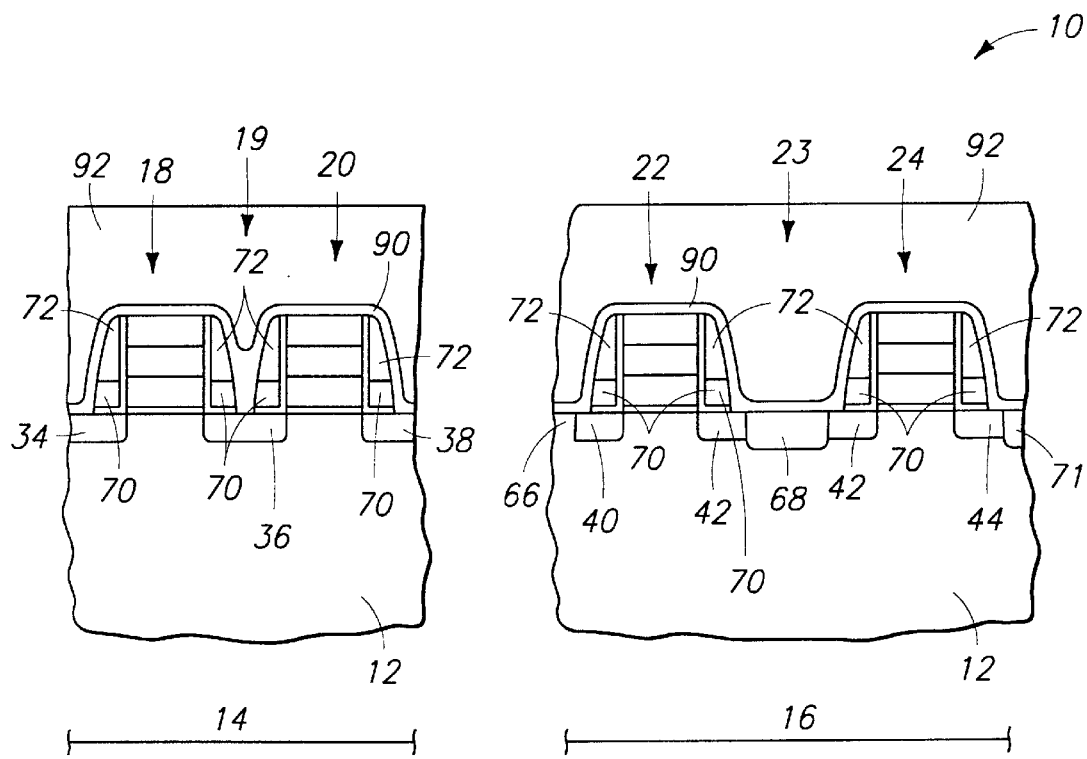
FIG. 8 is a view of the FIG. 1 wafer fragment shown at a processing step subsequent to that of FIG. 7.

Referring to FIG. 8, a first insulative material 90 is formed over memory array region 14 and peripheral circuitry region 16, and a second insulative material 92 is formed over first insulative material 90. First insulative material 90 can comprise, for example, silicon dioxide chemical vapor deposited from tetraethylorthosilicate (TeOS), and second insulative material 92 can comprise, for example, borophosphosilicate glass (BPSG). Silicon dioxide material 90 is provided to impede dopant from migrating from BPSG 92 into underlying substrate 12.

Referring to FIG. 9, openings are etched through insulative materials 90 and 92 within gap 19 of memory array region 14, as well as within gap 23 of peripheral circuitry region 16. The opening in memory array region 14 is labeled as 94, and the opening in peripheral circuitry region 16 is labeled as 96. (It is noted that it is unnecessary for 96 to cover the whole gap, see FIG. 11.) Openings 94 and 96 are filled with conductive materials 98 and 100, respectively. Such conductive materials can comprise, for example, conductively doped polysilicon and/or metal. Conductive materials 98 and 100 form electrical contacts to conductively doped regions 36 and 68, respectively. The upper surfaces of conductive materials 98 and 100 are shown to be planarized together with an upper surface of insulative material 92. Such planarization can be accomplished by, for example, chemical-mechanical polishing (CMP).

The formation of openings 94 and 96 can be referred to as a self-aligned contact etch, indicating that the openings are aligned relative to spacers 76, 78, 84 and 86. Note that the larger spacing between peripheral circuitry transistors 22 and 24 relative to the spacing between memory array spacers 18 and 20 has led to a larger cross-sectional width of opening 96 (which is aligned relative to spacers 84 and 86) relative to the width of opening 94 (which is aligned relative to spacers 76 and 78). Openings 94 and 96 can be formed simultaneously, and accordingly in a common etch step. Also, conductive materials 94 and 96 can comprise the same composition as one another, and can be formed in one or more common deposition steps.

Another embodiment of the invention is described with reference to FIGS. 10 and 11. In referring to FIGS. 10 and 11, the same numbering will be utilized as was used above in describing FIGS. 1–9. FIG. 10 shows wafer fragment 10 at a processing step subsequent to that of FIG. 6. FIG. 10 differs from FIG. 7 (which showed wafer fragment 10 at a processing step subsequent to FIG. 6 in accordance with the above-described first embodiment of the invention) in that protective material 70 has not been removed from within gaps 19 and 23. Instead, a BPSG material 92 has been formed over the FIG. 6 structure. Note that BPSG material 92 was also utilized in the embodiment of FIGS. 1–9 (see, for example, FIG. 8), but a layer of silicon oxide was provided beneath the BPSG material 92 to protect substrate 12 from dopants that may out-diffuse from BPSG 92. In the embodiment of FIG. 10, protective material 70 serves the function of the silicon oxide layer 90 of the previous embodiment. It is noted, however, that an additional layer of silicon oxide could be provided over protective material 70 prior to provision of insulative material 92. Specifically, chemical vapor deposition of silicon dioxide from TeOS could occur provision of BPSG material 92 in FIG. 10 to form a silicon oxide material over memory array region 14 and peripheral circuitry region 16 analogous to the silicon dioxide material 90 of FIG. 8, with such silicon dioxide material overlying protective material 70 in gaps 19 and 23 of the FIG. 8 structure.

Figure 11:
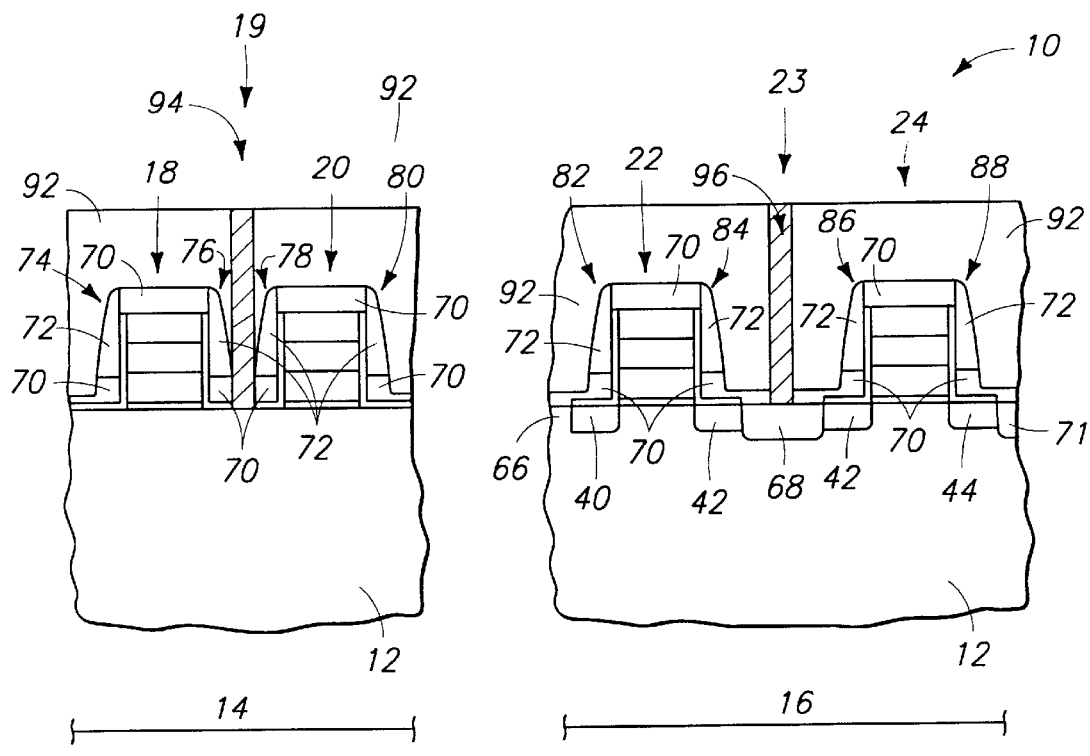
FIG. 11 is a view of the FIG. 1 wafer fragment shown at a processing step subsequent to that of FIG. 10.

Referring to FIG. 11, openings 94 and 96 are etched through material 92 and to substrate 12 within gaps 19 and 23, respectively. A difference between the processing of FIG. 11 and that discussed previously with reference to FIG. 9 is that opening 94 of FIG. 11 is etched through materials 92, 70 and 46, whereas opening 94 of FIG. 9 was etched through materials 92 and 90. In embodiments in which materials 92 and 90 comprise BPSG and silicon dioxide, respectively, and in which materials 70 and 46 comprise silicon dioxide and silicon nitride, respectively, a particular difference between the processing of FIG. 11 and that of FIG. 9 is that opening 94 of FIG. 11 is etched through a silicon nitride layer (46), whereas opening 94 of FIG. 9 is not. If silicon nitride material 46 is kept thin enough, the etching through such layer can cause few complications during formation of opening 94 in the FIG. 11 processing. However, if material 46 becomes too thick, then severe etching of nitride spacers 72 can occur during the time needed for removal of nitride material 46. The severe etching of nitride spacers 72 can lead to device failure. Accordingly, if the processing of FIG. 11 is utilized, it is preferred that nitride material 46 have a thickness of less than or equal to about 50 Angstroms.

A further difference shown between FIG. 11 and FIG. 9 is that opening 96 of FIG. 11 is not aligned relative to spacers 84 and 86. Such represents a process variation that can be incorporated into methods of the present invention.

Figure 12:
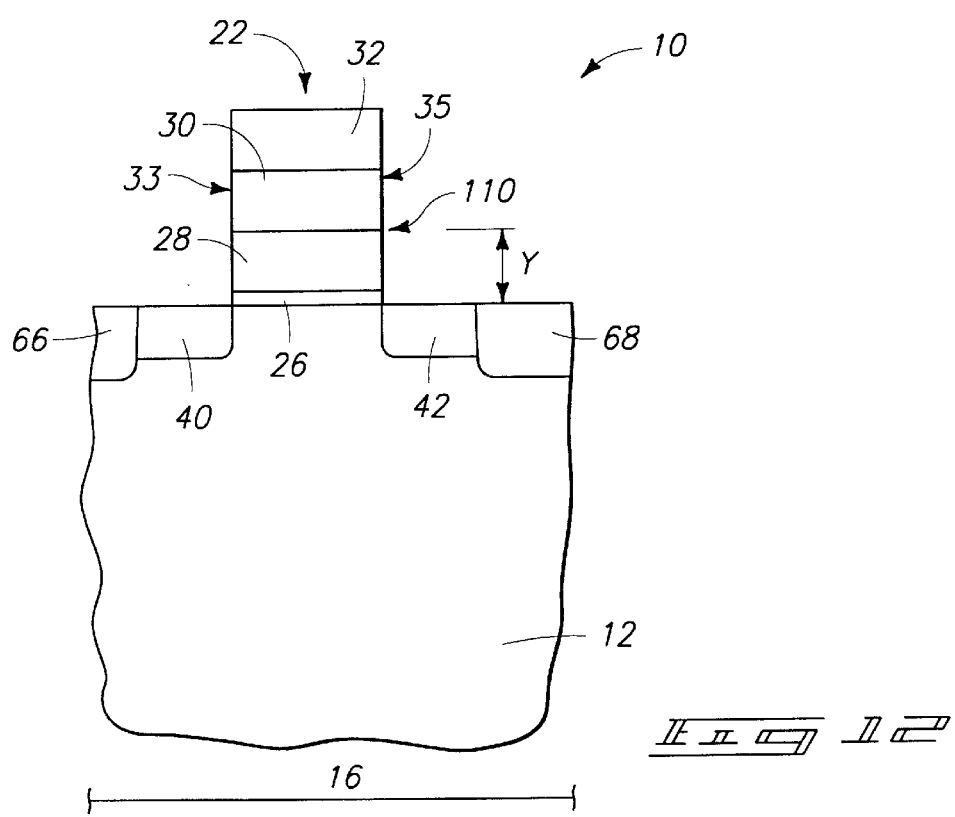
FIG. 12 is an enlarged view of a portion of the FIG. 1 wafer fragment shown at a processing step subsequent to that of FIG. 4, and in accordance with a third embodiment of the present invention.

A further aspect of the present invention is described with reference to FIGS. 12–15. In referring to FIGS. 12–15, identical numbering will be used as was used above. FIG. 12 shows a portion of peripheral region 16 at a processing step subsequent to that of FIG. 4. Specifically, FIG. 12 shows an enlarged view of transistor gate 22, and a region of substrate 12 proximate transistor gate 22. Etch-stop material 46 (FIG. 4) has been removed in the FIG. 12 structure. If etch-stop material 46 comprises silicon nitride, such can be removed by, for example, a wet etch utilizing phosphoric acid.

The removal of material 46 exposes sidewalls 33 and 35 of transistor gate 22. As discussed previously, transistor gate 22 comprises a conductive structure including conductively-doped semiconductive material 28 and metal-containing material 30, and an insulative cap 32 over the conductive structure. Further, sidewalls 33 and 35 comprise conductive portions defined by a conductive edge of conductively-doped semiconductive material 28 and a conductive edge of metal-containing material 30. It is noted that metal-containing material 30 and conductively-doped semiconductive material 28 join at an interface 110 which is at an elevational height "Y" above an upper surface of substrate 12.

Referring to FIG. 13, protective material 70 and spacer material 72 are formed over and adjacent transistor gate 22 in processing analogous to that described above with reference to FIG. 5. Accordingly, protective material 70 preferably comprises silicon dioxide formed utilizing a high density plasma, and spacer material 72 preferably comprises silicon nitride. Materials 70 and 72 join at an interface 112 which is at an elevational level "Z" above the upper surface of substrate 12. Elevational level "Z" is preferably at or below the elevational level "Y" of the interface 110 between conductively-doped semiconductive material 28 and metal-containing material 30, and in the shown embodiment is below elevational level "Y". Accordingly, silicon dioxide material 70 is along portions of sidewalls 33 and 35 defined by conductively-doped semiconductive material 28, but is not along portions of sidewalls 33 and 35 defined by metal-containing material 30.

Referring to FIG. 14, materials 70 and 72 are subjected to anisotropic etching to form spacers 120 and 122. Such spacers preferably comprise a silicon nitride portion defined by material 72 which is entirely along the portions of sidewalls 33 and 35 defined by metal-containing material 30. The spacers also preferably comprise a silicon oxide portion 70 along at least part of the portions of sidewalls 33 and 35 defined by conductively-doped semiconductive material 28.

Figure 15:
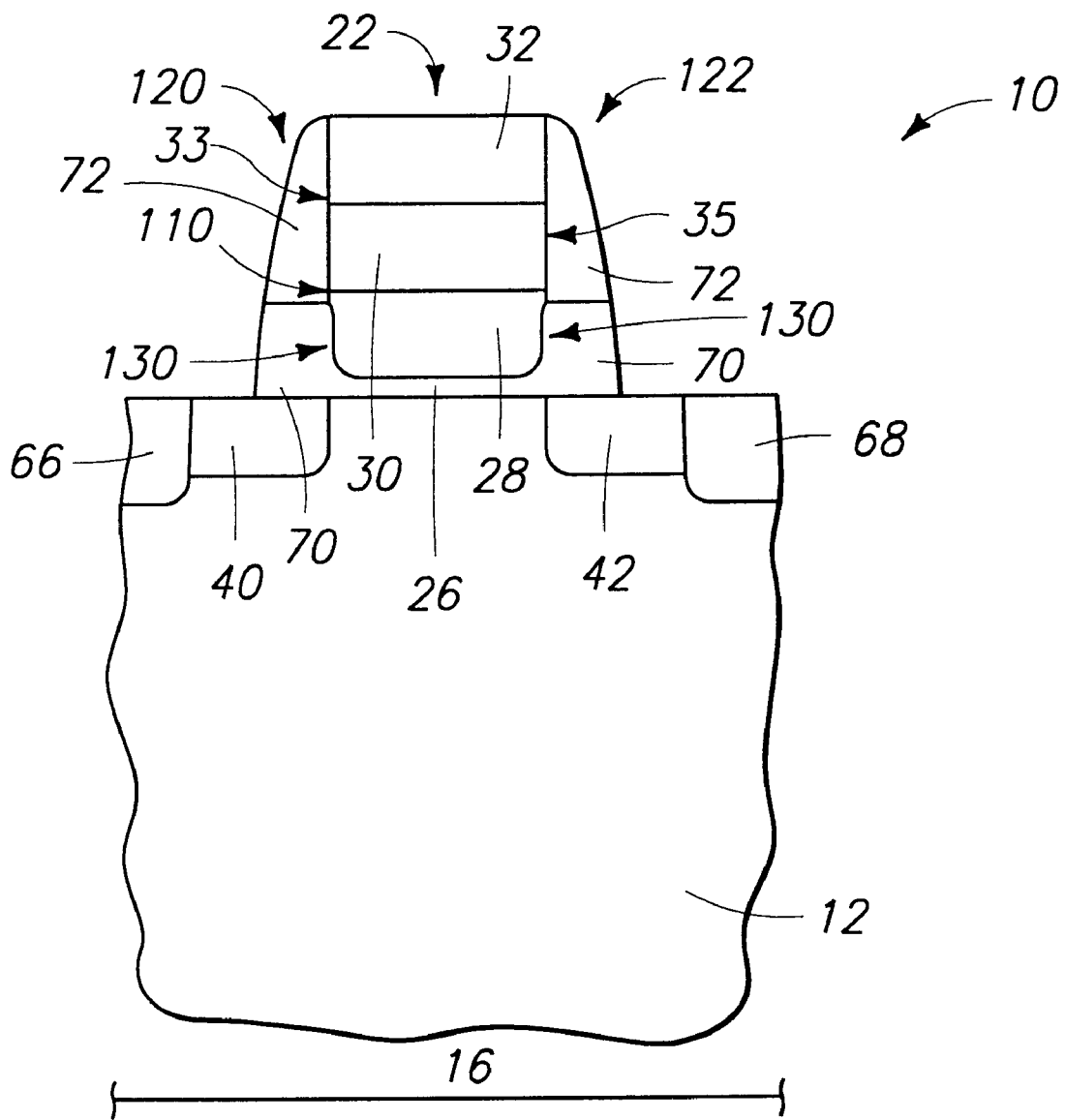
FIG. 15 is a view of the FIG. 12 portion shown at a processing step subsequent to that of FIG. 14.

Referring to FIG. 15, wafer 10 is exposed to oxidizing conditions. Nitride portions 72 of spacers 120 and 122 prevent oxidant from reaching the portions of sidewalls 33 and 35 defined by metal-containing material 30. The oxidant, however, penetrates silicon oxide material 70 of spacers 120 and 122 to oxidize portions of sidewalls 33 and 35 along the silicon oxide material 70, and accordingly forms oxidized portions 130 of the sidewalls defined by conductively-doped semiconductive material 28. Suitable oxidizing conditions can comprise, for example, $H_2O$ or $O_2$ with a carrier gas, such as Ar. Additionally, $H_2$ can be added.

The methodology of FIGS. 12–15 can be utilized to protect sidewalls of a metal-containing material while oxidizing sidewalls of a conductively-doped semiconductive material adjacent the metal-containing material. It can be advantageous to thicken a gate oxide layer at a corner of the gate to reduce Gate Induced Drain Leakage (GIDL), and such is accomplished by the shown method by oxidation of the sidewalls defined by conductively-doped semiconductive material 28. However, it is preferred that sidewall edges of metal-containing material 30 not be oxidized during the oxidation of the sidewalls of semiconductive material 28, as such oxidation of metal-containing material 30 could result in lifting of a metal line defined by metal-containing material 30, and lead to failure of a field effect transistor incorporating gate 22. The methodology of FIGS. 12–15 enables selective oxidation of the lower corners of gate 22, while protecting sidewalls of metal-containing material 30.

It is noted that although the embodiment of FIGS. 12–15 shows nitride material 46 (FIG. 4) removed prior to formation of spacers 120 and 122, the invention encompasses other embodiments wherein nitride material 46 remains along sidewalls 33 and 35 as spacers 120 and 122 are formed. If the metal nitride material 46 is too thick, it can form a barrier between silicon oxide portion 70 and semiconductive material 28 which impedes flow of oxygen into sidewalls of semiconductive material 28. However, if silicon nitride material 46 is kept sufficiently thin (i.e., to a thickness of less than about 50 Angstroms), enough oxygen may flow through the nitride layer to accomplish the oxidation described with reference to FIG. 15.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A structure of memory array and peripheral circuitry, comprising:
   a substrate having a memory array region and a peripheral circuitry region;
   a pair of adjacent memory transistor gates associated with the memory array region of the substrate;
   a pair of adjacent peripheral transistor gates associated with the peripheral region of the substrate, the adjacent peripheral transistor gates being further apart than the adjacent memory transistor gates,
   a plurality of spacers comprising a layer of silicon oxide between a pair of silicon nitride layers, some of the spacers being between the adjacent memory transistor gates, and others of the spacers being between the adjacent peripheral transistor gates; individual spacers between the adjacent memory transistor gates comprising a same composition and lateral width as one another, and as individual spacers between the adjacent peripheral transistor gates; and
   source/drain regions proximate the peripheral transistor gates and spaced from the peripheral transistor gates by more than the lateral width of the spacers between the peripheral transistor gates.

2. The structure of claim 1 wherein the layer of silicon dioxide comprises a thickness of about 600 angstroms.

3. The structure of claim 1 wherein the pair of adjacent memory transistor gates are spaced apart from each other by a distance of from about 0.1 microns to about 0.25 microns.

4. The structure of claim 1 wherein the pair of adjacent peripheral transistor gates are spaced apart from each other by a distance of from about 0.2 microns to about 10 microns.

5. The structure of claim 1 wherein the silicon oxide layer comprises silicon dioxide.

6. The structure of claim 1 further comprising:
   an insulative material over the memory array region and over the peripheral region, the insulative material being over the pair of memory transistor gates and over the pair of peripheral transistor gates;
   first and second openings extending through the insulative material, the first opening extending between the pair of adjacent memory transistors and the second opening extending between the pair of adjacent peripheral array transistors;
   a first conductive material within the first opening; and
   a second conductive material within the second opening.

7. The structure of claim 6 wherein the second opening comprises a greater width than the first opening.

8. A structure of memory array and peripheral circuitry, comprising:
   a substrate having a memory array region and a peripheral circuitry region;
   a memory transistor gate associated with the memory array region of the substrate;
   a peripheral transistor gate associated with the peripheral region of the substrate;
   a memory transistor gate spacer along a sidewall of the transistor gate;
   a peripheral transistor gate spacer along a sidewall of the peripheral gate; the memory transistor gate spacer and the peripheral transistor gate spacer comprising a same spacer composition and lateral width as one another, the spacer composition comprising a layer of silicon oxide between a pair of silicon nitride layers, the pair of silicon nitride layers comprising a first silicon nitride layer and a second silicon nitride layer, the first silicon nitride layer being on the silicon oxide layer and joining the silicon oxide layer at an interface at a first elevational level above an upper surface of the substrate.

9. The structure of claim 8 further comprising a source/drain region proximate the peripheral transistor gate and spaced from the peripheral transistor gate by more than the lateral width of the peripheral transistor gate spacer.

10. The structure of claim 8 wherein the second silicon nitride layer comprises a thickness of less than or equal to about 50 angstroms.

11. The structure of claim 8 wherein the peripheral transistor gate comprises a metal-containing material over a semiconductive material, the metal-containing material joining the semiconductive material at an interface at a second elevational level above the upper surface of the substrate, the second elevational level being greater than the first elevational level.

* * * * *

UNITED STATES PATENT AND TRADEMARK OFFICE
CERTIFICATE OF CORRECTION

PATENT NO.    : 6,501,114 B2
DATED         : December 31, 2002
INVENTOR(S)   : Cho et al.

It is certified that error appears in the above-identified patent and that said Letters Patent is hereby corrected as shown below:

Column 5,
Line 22, please insert -- , -- after "60".

Signed and Sealed this

Tenth Day of June, 2003

JAMES E. ROGAN
*Director of the United States Patent and Trademark Office*